United States Patent
Watanabe (10) Patent No.: US 7,518,386 B2
(45) Date of Patent: Apr. 14, 2009

(54) PROBE CARD HAVING A LEAF SPRING

(75) Inventor: Takeshi Watanabe, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/688,356

(22) Filed: Mar. 20, 2007

(65) Prior Publication Data

US 2007/0216430 A1     Sep. 20, 2007

(30) Foreign Application Priority Data

Mar. 20, 2006     (JP)     ............................. 2006-076103

(51) Int. Cl.
*G01R 31/02*     (2006.01)
(52) U.S. Cl. ..................................... 324/754
(58) Field of Classification Search ........................ None
See application file for complete search history.

(56) References Cited

U.S. PATENT DOCUMENTS 5,825,192 A * 10/1998 Hagihara ..................... 324/757

7,081,005 B2 * 7/2006 Inoue et al. .................. 439/482
2004/0223309 A1 * 11/2004 Haemer et al. .............. 361/767

FOREIGN PATENT DOCUMENTS

JP     2006041333 A   *   2/2006

* cited by examiner

*Primary Examiner*—Paresh Patel
(74) *Attorney, Agent, or Firm*—Yingsheng Tung; Wade J. Brady, III; Frederick J. Telecky, Jr.

(57) ABSTRACT

The objective of the present invention is to provide a type of probe assembly with a long lifetime and low cost, as well as a type of probe card using same. Probe assembly 100 attached on the probe card has probe holder 200 that holds plural probes Q at prescribed positions and leaf spring mechanism 300 with probe holder 200 attached on it. Said leaf spring mechanism 300 has leaf spring cover 360 connected to probe card base plate 410 and leaf spring 330, as well as pin row base plate 310 with probe holder 200 attached on it. When the bump electrodes are contacted, pin row base plate 310 can move towards leaf spring cover 360 via leaf spring 330.

8 Claims, 14 Drawing Sheets

PROBE CARD HAVING A LEAF SPRING

FIELD OF THE INVENTION

The present invention pertains to a probe card for contacting probes to electrodes, pads, etc., formed on a semiconductor substrate or a semiconductor wafer. Especially, the present invention pertains to a probe assembly attached to a probe card.

BACKGROUND OF THE INVENTION

Probe cards have been used for testing semiconductor integrated circuits formed on wafers on the wafer level. As described in Japanese Kokai Patent Application No. 2006-041333, a probe card has plural vertical probe pins and MLC/MLO or other base plates for multilayer relays.

Figure 16:
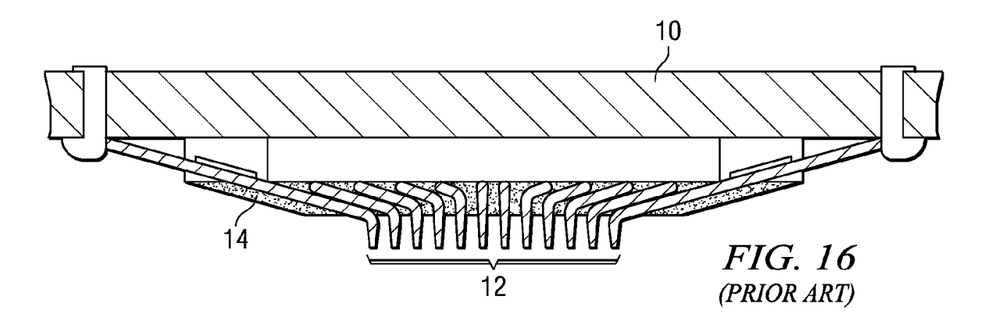
FIG. 16 is a cross-sectional view schematically depicting a cantilever-type probe card in the prior art.
Figure 17A:
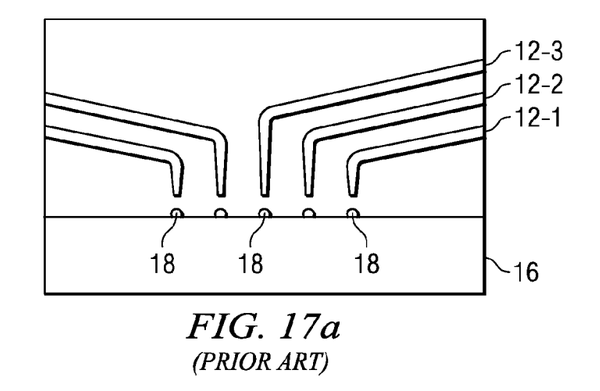
FIG. 17(a) and FIG. 17(b) are diagrams depicting the rows of the cantilever-type probe card in the prior art as well as overdrive.

FIG. 16 is a schematic cross-sectional view illustrating a cantilever-type probe card in the prior art. As shown in the figure, the probe card has probe card base plate 10 and resin 14 with which plural probes 12 are attached on the probe card. Said resin 14 is fixed on probe card base plate 10. The probes fixed by a resin or the like form a so-called pin row, and plural pin rows may be set to form a two-dimensional configuration. Usually, 1-3 pin rows are set. FIG. 17(*a*) is a schematic diagram illustrating the configuration of a 3-row pin configuration. It includes first row of probes 12-1, second row of probes 12-2, and third row of probes 12-3.

Figure 17B:
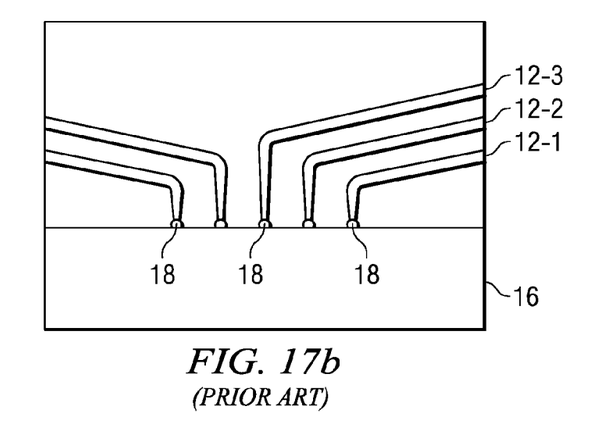

In the prior art, in order to lower the electrical resistance between the probes and bump electrodes, the probes are overdriven so that the tip portions of the probes slide on the bump electrodes to remove the natural oxide film or other resistance components on the surface of the bump electrodes, and guarantee a sufficient contact area. As shown in FIG. 17(*a*), for the cantilever-type probes, the probes are first positioned with respect to bump electrodes 18 of wafer 16. Then, as shown in FIG. 17(*b*), probes 12-1, 12-2, 12-3 of the 3-row pins are overdriven, that is, they are further pressed from the state when they are in contact with bump electrodes 18.

Figure 18:
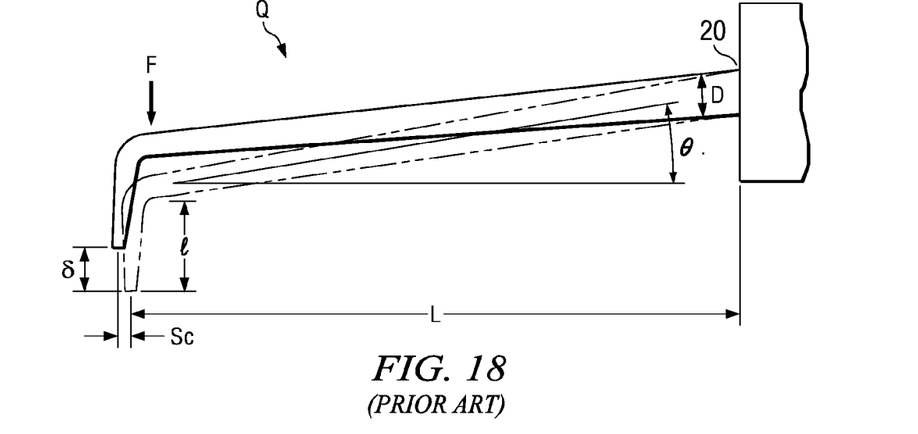
FIG. 18 is a diagram depicting displacement of the cantilever-type probe card in the prior art.

FIG. 18 is a diagram illustrating the state of displacement of the probes when said cantilever-type probes are overdriven. The overdriven probes have their tips displaced around supporting point 20. In the figure, δ represents the overdrive distance (deflection), F represents the pin pressure (contact pressure), Sc represents the scrub distance (sliding distance), D represents the diameter of the wire (diameter of the probe pin), L represents the free end length (installing length), l represents the tip length, and θ represents the incident angle (attaching angle).

Assume that the probes are made of ReW; the pin diameter is 200 μm; the beam length is 3,500 μm; the tip diameter is 80 μm; and the overdrive is 60 μm. Table 1 lists the relationships among the length from the bending portion of each row to the tip (tip length), pin pressure F, and sliding distance Sc.

TABLE 1

|            | Tip length | Pin pressure F | Sliding distance Sc |
|------------|------------|----------------|---------------------|
| First row  | 250 μm     | 5.6 g          | 12.4 μm             |
| Second row | 450 μm     | 5.6 g          | 18.0 μm             |
| Third row  | 650 μm     | 5.8 g          | 23.2 μm             |

Here, one should note the sliding distance Sc of each row when the overdrive is applied. Because different rows have different tip lengths of the probes, different rows have significantly different values of distance Sc.

When the contact object is a bonding pad, gold bump, lead solder bump or other material with relatively low hardness, even if pin pressure F of the probe is not very high, the contact resistance still can be effectively suppressed. However, for a lead-free bump electrode or other contact object with high hardness, a high pin pressure F is required. When overdrive is applied such that prescribed pin pressure F is met for all of the probes, as explained above, because different rows have different values of sliding distance Sc, for certain probes (such as those of the third row), the sliding distance Sc may become excessive. Because sliding distance Sc becomes a probe trace on the bump electrode, a probe trace over the tolerable range leads to deterioration of the bump electrode, and deterioration in the appearance of the bump electrode. Also, depending on the probe, when sliding distance Sc increases, the quantity of metal cut off by the tip of the probe increases, the quantity of debris of the bump deposited on the tip of the probe increases, and the cleaning frequency of the probe increases. As a result, the lifetime of the probe decreases. As a result, it is necessary to ensure that the difference in the sliding distance between different rows is small.

As one scheme to address the aforementioned problem, the probe may be made of BeCu (beryllium copper) with a relatively low hardness so as to reduce the difference in the sliding distance, that is, probe trace, between different rows. However, in this method, the probes themselves wear out, so that the lifetime of the probes decreases, and this is undesirable.

Figure 19A:
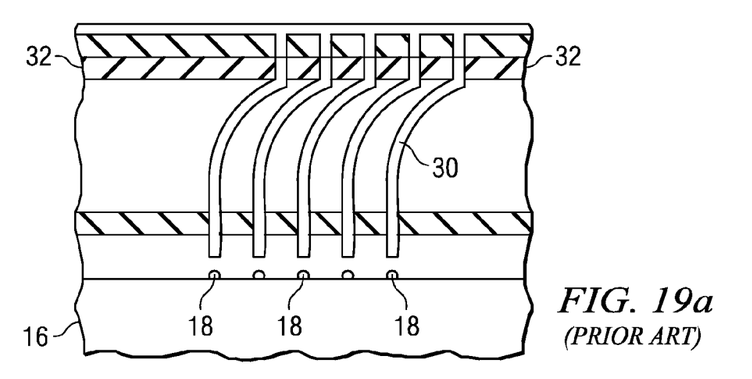
FIG. 19(a) and FIG. 19(b) are diagrams depicting a cobra-type vertical probe card in the prior art.
Figure 19B:
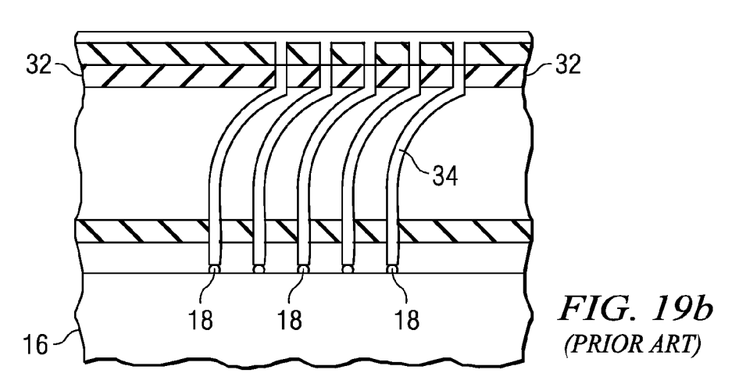

As another scheme to address the aforementioned problem, a vertical-type probe card represented by the cobra-type shown in FIG. 19(*a*) and FIG. 19(*b*) may be used. For a cobra-type vertical probe card, the end portions of probes 30 are fixed by resin 32 and the probe tips are aligned. When the probe tips are brought in contact with metal bump 18, as shown in FIG. 19(*b*), as overdrive is applied, bending portion 34 of each of probes 30 elastically deforms. Because the various probes have the same shape, even when the probes are overdriven, the pin pressure and sliding distance are the same for the various probes. As a result, it is possible to suppress the probe traces on bump electrodes 18 to within a prescribed range.

Consequently, with a cobra-type vertical probe card, the problem associated with a cantilever-type probe card probing a bump electrode made of a lead-free material is not present. However, when a device with a low number of probes (such as about 54 pins) is manufactured, as noted in Table 2, compared with the cantilever-type, the initial cost of a cobra-type vertical probe card is very high. As a result, a cobra-type vertical probe card is inappropriate for small-quantity multi-type manufacturing.

TABLE 2

|                    | Cantilever-type | Vertical type |                 |
|--------------------|-----------------|---------------|-----------------|
| Cleaning frequency | 20              | 100           | [Contact/Clean] |
| Lifetime of probe  | 450             | 3500          | [K Contact]     |
| Initial cost       | 340             | 1000          | [¥1,000]        |
| Operating cost     | 1100            | 370           | [¥]             |

SUMMARY OF THE INVENTION

The objective of the present invention is to solve the aforementioned problems of the prior art by providing a probe assembly and a probe card with a longer lifetime, and it is possible to cut the cost even for small-quantity multi-type manufacturing.

Another purpose of the present invention is to provide a probe assembly that can have reliable electrical contact without causing appearance defects on a bump electrode even for a contact object with relatively high hardness, such as lead-free bump electrode, and to provide a probe card using the probe assembly.

The present invention provides a type of probe assembly characterized by the following facts: the probe assembly attached on a probe card; it has a holding block that holds plural probes at prescribed positions, and an elastic mechanism unit for attaching the holding block; the elastic mechanism unit has a first connecting member connected to the probe card and a second connecting member that attaches the holding block; and the second connecting member can be driven to move towards and away from the first connecting member via an elastic member.

As a preferable scheme, the second connecting member has the holding block attached on a first surface, and has the elastic member attached on a second surface facing the first surface; the elastic member is in contact with a protrusion formed on the first connecting member, and it can elastically deform with the protrusion as a supporting point.

As a preferable scheme, the elastic member is a leaf spring made of a metal material. The leaf spring has a base portion and plural spring parts extending from the base portion; the base portion is fixed on the second connecting member, and the end portions of the plural spring parts are in contact with the protrusion of the first connecting member. It is preferred that the plural spring parts be set in a configuration of linear symmetry or rotary symmetry with respect to the base portion.

In addition, the leaf spring may contain plural loss-prevention fin parts formed in its base portion, and the second connecting member may be suspended on the first connecting member by means of the plural loss-prevention fin parts. Also, a regulating member that defines the movement distance of the second connecting member to the first connecting member may be attached on the first connecting member. In addition, the holding block may be attached on the second connecting member in a way that provides quick-connect and quick-disconnect. As a result, it is possible to exchange the holding block according to the number and configuration of the bump electrodes on the wafer as the contact object.

For the probe assembly of the present invention, instead of letting the probes have a spring function, a holding block for holding the probes is elastically supported by an elastic mechanism unit such as a leaf spring mechanism. As a result, it is possible to simplify the probe shape, and it is possible to select a wear resistant material for the probes. As a result, it is possible to cut the cost and to obtain a probe assembly with a longer lifetime. In addition, when the holding block is driven to move towards the contact object, when the movement distance is regulated, the sliding distance on the bump electrodes can be set smaller than a prescribed distance, and it is possible to reduce defects in appearance due to the probe trace on the bump electrodes. In addition, it is possible to reduce the quantity of bump metal deposited on the probe tips, and to decrease the cleaning frequency of the probes.

In the following, a detailed explanation will be given regarding the optimum embodiment of the present invention with reference to figures.

BRIEF DESCRIPTION OF THE DRAWINGS

FIG. 13(a) and FIG. 13(b) are cross-sectional views depicting the operation of the probe assembly. FIG. 13(a) shows the positioned state, and FIG. 13(b) shows the overdriven state.

REFERENCE NUMERALS AND SYMBOLS AS SHOWN IN THE DRAWINGS

In the figures, 100 represents a probe assembly, 110 a bump electrode, 200 a probe holder, 210 a holder main body, 220 a wiring substrate, 222 a soldering pad, 224 a coated wiring, 230 a through-hole, 240 a threaded hole, 250 a through-hole, 260 a threaded hole, 270 a screw, 290 a smaller-diameter portion, 292 a larger-diameter portion, 300 a leaf spring mechanism, 310 a pin row base plate, 312 a protrusion, 314 a through-hole, 316 a rib, 318 a thick portion, 320 a leaf spring receptacle, 322 an opening, 324 an opening, 326 a threaded hole, 330 a leaf spring, 332 a base portion, 334 an opening, 336 a spring part, 338 a loss-prevention fin part, 340 a leaf spring spacer, 342 an opening, 344 a nut, 350 a flat countersunk head screw, 360 a leaf spring cover, 362 an opening, 364 an opening, 366 an opening for flat countersunk head screw, 368 a protrusion, 370 a cap, 372 a leg portion, 374 an opening for flat countersunk head screw, 376 a flat countersunk head screw, 400 a probe card, 410 a probe card base plate, 412 a pin hole, 420 a flat countersunk head screw, 430 a nut, 500 a positioning fixture, 510 a pin, Q a probe.

DESCRIPTION OF THE EMBODIMENTS

According to the present invention, since it is necessary to manufacture an inexpensive probe card for a relatively small number of pins with lead-free bumps, studies have been conducted to determine which cards can be manufactured, based on the following.

1. Because the dispersion in the bump height of the lead-free material on the wafer surface can be kept within 5

μm, the bump height dispersion in a single round of contact of the probes can be ignored.

2. The bumps themselves have a plastic property.

For these two reasons, as opposed to the prior art in which a spring function should exist for each probe, the probe functions are assembled into a single one, so that the probe card can be manufactured at a lower price. Here, the probe assembly shown in FIG. 1 can be prepared, and it is mounted on the probe card.

Figure 1:
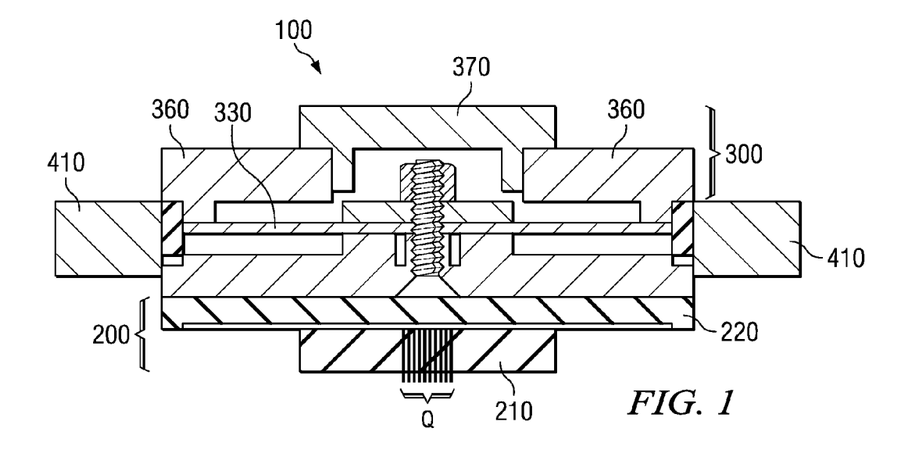
FIG. 1 is a schematic cross-sectional view depicting the probe assembly in a preferable embodiment of the present invention.

Probe assembly 100 has probe holder 200 that holds plural probes Q at prescribed positions, and leaf spring mechanism 300 for attaching probe holder 200. Although probes Q held on probe holder 200 themselves do not have a spring function, leaf spring mechanism 300 has a spring function, and probe holder 200 is elastically supported by it.

Figure 2A:
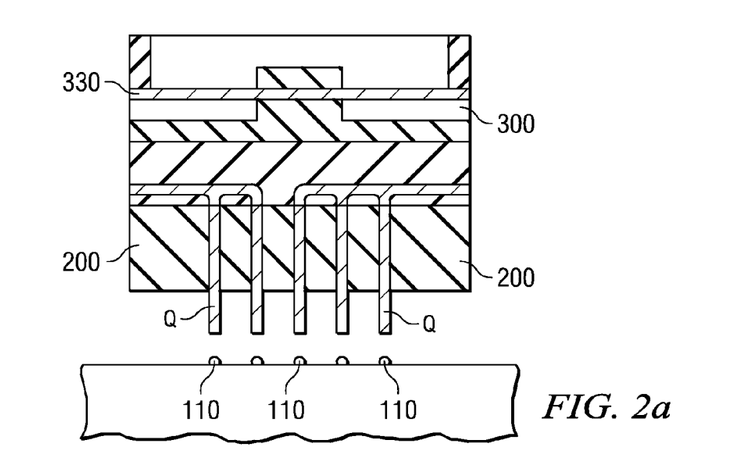
FIG. 2(a) and FIG. 2(b) are diagrams depicting the state of overdrive of probes of the probe assembly shown in FIG. 1.
Figure 2B:
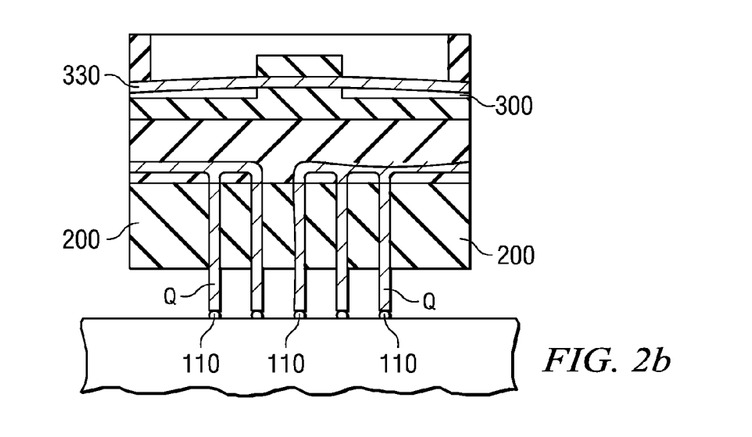

FIG. 2(a) and FIG. 2(b) are diagrams depicting schematically the operation of the probe assembly in this embodiment. As shown in FIG. 2(a), probes Q are positioned corresponding to bump electrodes 110 formed on the wafer. Probes Q are in the state before overdrive, no load is applied to leaf spring 330 contained in leaf spring mechanism 300, and leaf spring 330 is not elastically deformed. Then, as shown in FIG. 2(b), probe assembly 100 is driven to move towards the wafer, and the tips of probes Q contact bump electrodes 110. Then, probes Q are overdriven so that probe assembly 100 is lowered. Since a load from bump electrodes 110 is applied via probes Q to leaf spring mechanism 300, leaf spring 330 elastically deforms into a convex shape, and probes Q contact bump electrodes 110 with a prescribed contact pressure.

Figure 3:
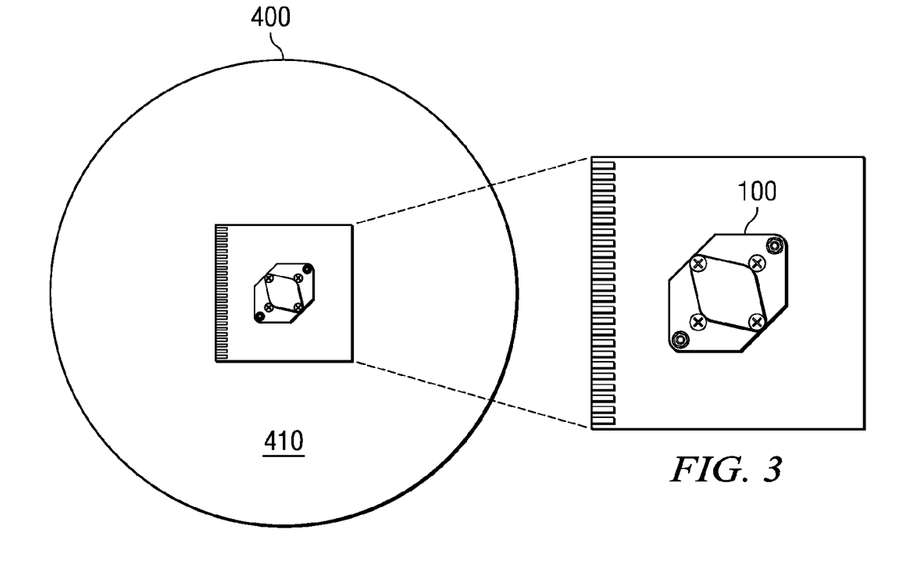
FIG. 3 is a plan view depicting a probe card and the probe assembly of the present invention.

The probe assembly shown in FIG. 1 is preferably mounted on the probe card for use. FIG. 3 is a plan view illustrating the case when the probe assembly is assembled in a probe card. Probe card 400 contains circular probe card base plate 410, and probe assembly 100 is mounted in an opening formed at the center of base plate 410. On the outer surface of base plate 410, electronic parts needed for probe testing and contact pads for interface with an external device are formed.

Figure 4:
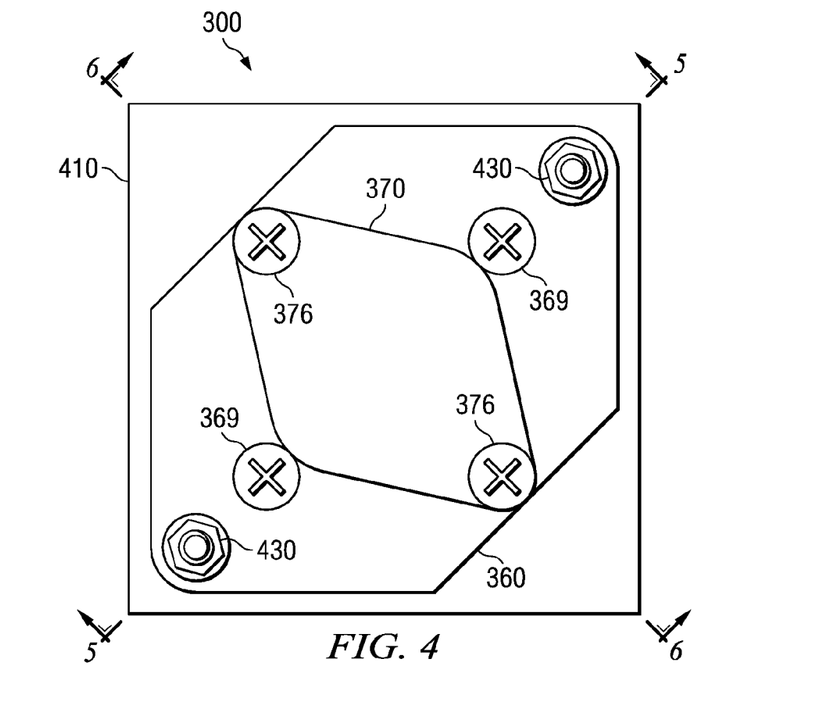
FIG. 4 is a plan view of the probe assembly.
Figure 5:
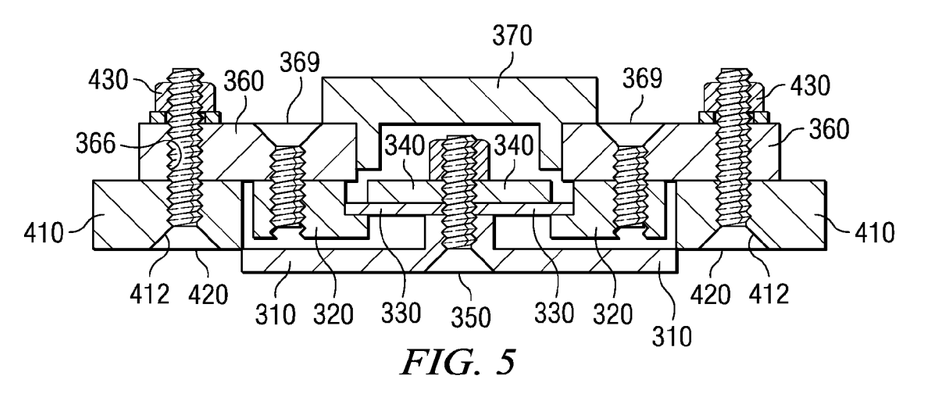
FIG. 5 is a cross-sectional views taken across 5-5 of the leaf spring mechanism in the probe assembly shown in FIG. 4.
Figure 6:
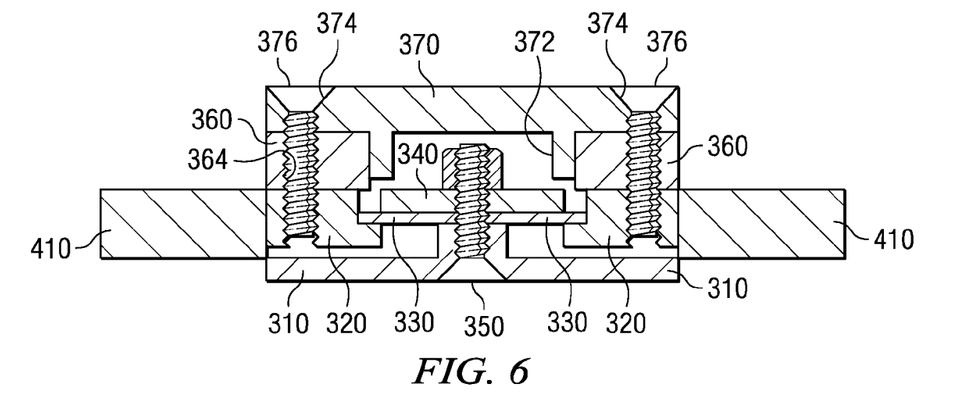
FIG. 6 is a cross-sectional view taken across 6-6 of the leaf spring mechanism in the probe assembly shown in FIG. 4.

In the following, a more detailed explanation will be given regarding the probe assembly of the present patent application. FIG. 4 is a plan view of the probe assembly; FIG. 5 is a cross-sectional view taken across 5-5 of the leaf spring mechanism of the probe assembly shown in FIG. 4; and FIG. 6 is a cross-sectional view taken across 6-6 of the leaf spring mechanism of the probe assembly shown in FIG. 4.

The leaf spring mechanism 300 of probe assembly 100 has the following parts: rectangular pin row base plate 310, leaf spring receptacle 320 mounted on pin row base plate 310, leaf spring 330 supported by the leaf spring receptacle 320, leaf spring spacer 340 mounted on leaf spring 330, flat countersunk head screw 350 used for fixing leaf spring 330 on pin row base plate 310, leaf spring cover 360, and cap 370 mounted on leaf spring cover 360. These parts will be explained with reference to the assembly operation of the leaf spring mechanism shown in FIGS. 7(a)-7(f).

Figure 7A:
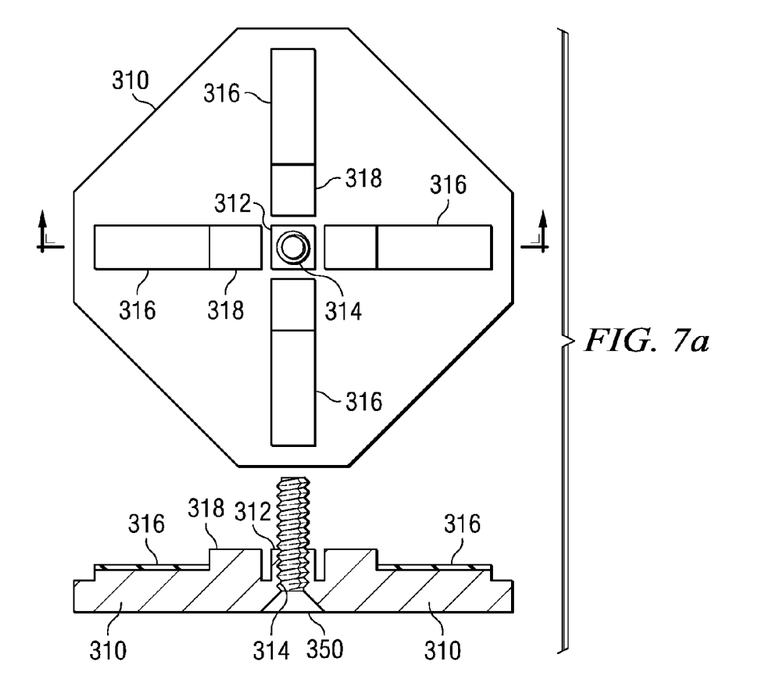
FIGS. 7(a)-7(f) are plan views and cross-sectional views depicting the assembly operation of the leaf spring mechanism.

In FIG. 7(a) a flat countersunk head screw is set on the pin row base plate. In the central portion of the outer surface of a metal pin row base plate 310 a rectangular protrusion 312 is formed. On the protrusion 312, through-hole 314 is formed for passage of flat countersunk head screw 350 through it. With protrusion 312 as the center, four ribs 316 are formed extending in the longitudinal and lateral directions at a mutual interval of 90°. On a portion of ribs 316, thick portion 318 with the same height as that of protrusion 312 is formed. From the inner surface of pin row base plate 310, flat countersunk head screw 350 is inserted into through-hole 314, and the tip of flat countersunk head screw 350 protrudes from protrusion 312.

Figure 7B:
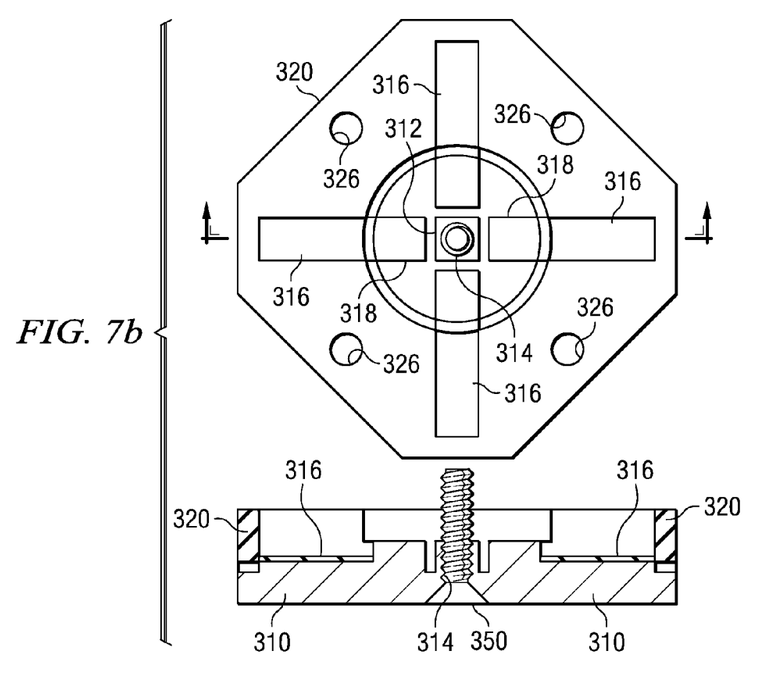
Figure 8:
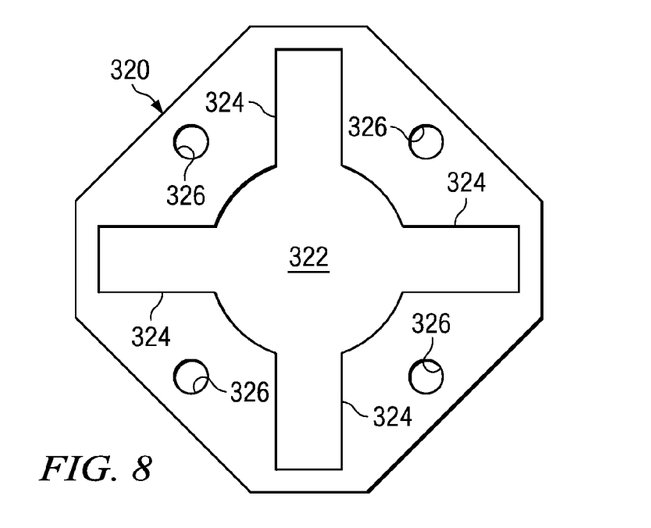
FIG. 8 is a plan view of the leaf spring receptacle.

In FIG. 7(b) the leaf spring receptacle is carried on the pin row base plate. The leaf spring receptacle 320 is made of an insulating resin. As shown in FIG. 8, it has the same outer shape as that of pin row base plate 310. Circular large opening 322 is formed at the center of leaf spring receptacle 320, and four rectangular openings 324 are formed extending in the longitudinal and lateral directions and are connected to opening 322. Also, between the four openings 324, four threaded holes 326 are formed equidistantly. The leaf spring receptacle 320 is carried on the outer surface of pin row base plate 310 such that the outer shape of leaf spring receptacle 320 corresponds with the outer shape of pin row base plate 310. The opening 322 allows exposure of protrusion 312 and thick portion 318, and the four openings 324 allow exposure of the four ribs 316, respectively.

Figure 7C:
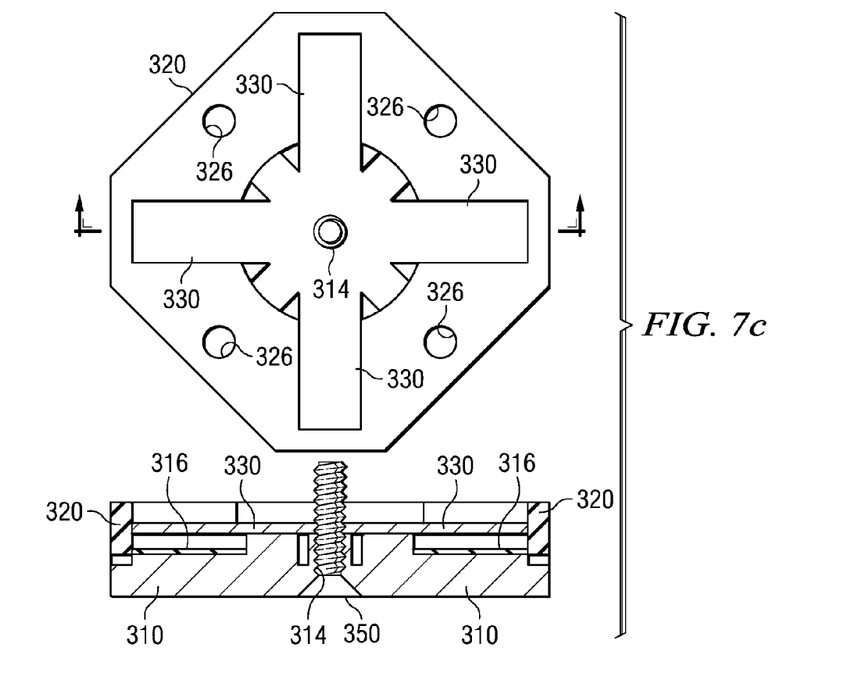
Figure 9:
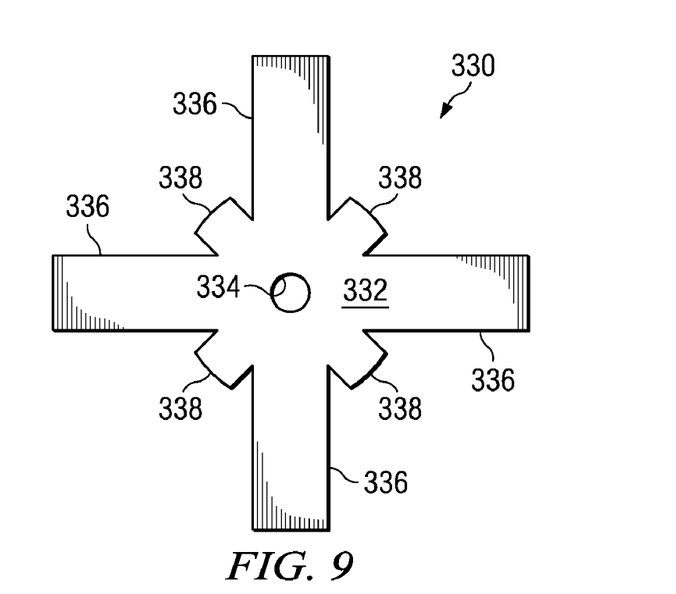
FIG. 9 is a plan view of the leaf spring.

FIG. 7(c) depicts the leaf spring. The leaf spring 330 is made of a stainless steel sheet with a thickness of 0.3 mm. As shown in FIG. 9, it has base portion 332 with opening 334 for the flat countersunk head screw formed at the center, four rectangular spring parts 336 extending linearly in the longitudinal and lateral directions at a mutual interval of 90° with base portion 332 as the center, and four loss-prevention fin parts 338 protruding slightly from base portion 332 between the four spring parts 336. The central opening 334 of the leaf spring 330 is in accordance with opening 314 of protrusion 312, and four spring parts 336 correspond with four ribs 316 when the leaf spring is carried on leaf spring receptacle 320. In this case, the four loss-prevention fin parts 338 protruding from opening 322 protrude outward from base portion 332 of leaf spring receptacle 320, and leaf spring 330 is supported on leaf spring receptacle 320 by means of loss-prevention fin parts 338.

Figure 7D:
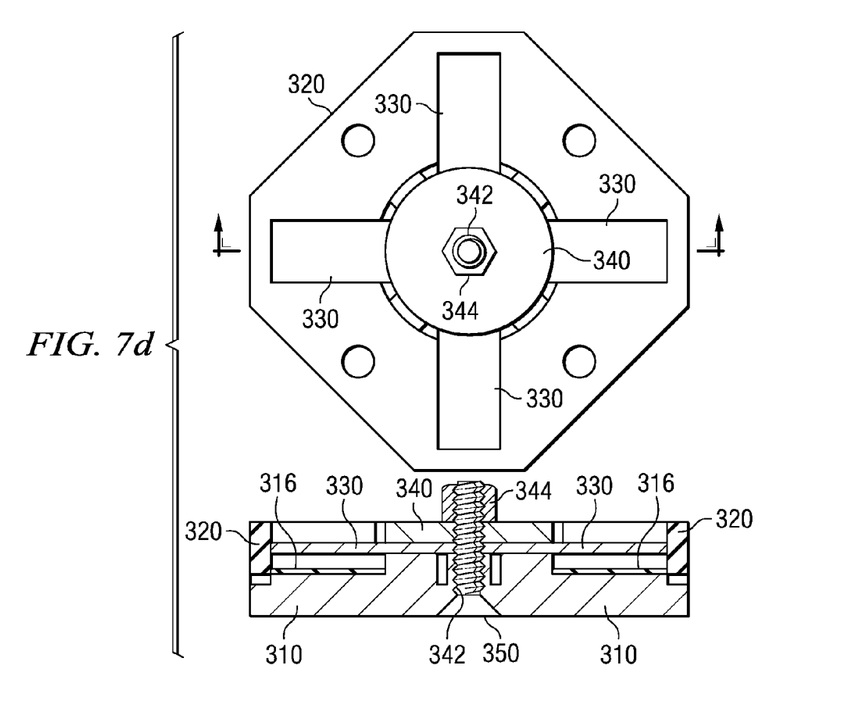

FIG. 7(d) depicts the leaf spring spacer. The leaf spring spacer 340 is a ring-shaped metal member with a prescribed thickness, and it has opening 342 formed at the center. The leaf spring spacer 340 is carried on leaf spring 330 such that its opening 342 corresponds with opening 334 of leaf spring 330. The flat countersunk head screw 350 protruding from opening 342 of leaf spring spacer 340 is fastened by nut 344, so that leaf spring spacer 340, leaf spring 330 and pin row base plate 310 are fixed.

Figure 7E:
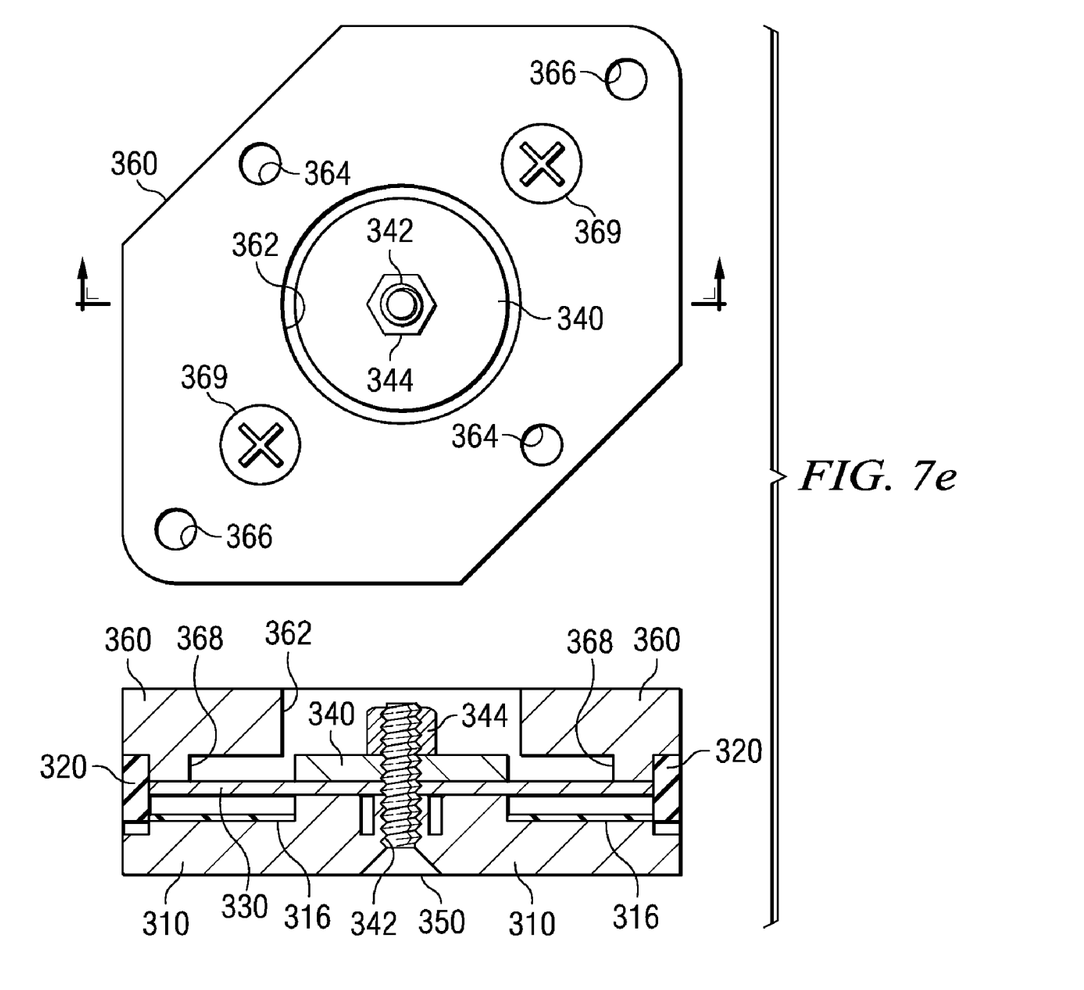

FIG. 7(e) depicts the leaf spring cover. The leaf spring cover 360 is made of a metal. The opening 362, which is a little larger than the outer diameter of leaf spring spacer 340, is formed at its center. On the periphery of opening 362, four openings 364 for flat countersunk head screws are formed. The openings 364 correspond to openings 322 of leaf spring receptacle 320, respectively. On the two end portions of leaf spring cover 360, another pair of openings 366 for flat countersunk head screws is formed. Also, on the inner surface of leaf spring cover 360, four protrusions 368 are formed.

The leaf spring cover 360 is carried on pin row base plate 310 such that leaf spring 330 is covered. In this case, central opening 362 fits leaf spring spacer 340, and four openings 364 for flat countersunk head screws fit four openings 322 of leaf spring receptacle 320, respectively. Among the four openings 364, from two opposite openings 364, flat countersunk head screws 369 are set towards openings 322. As a result, leaf spring cover 360 and leaf spring receptacle 320 are fixed. In addition, protrusions 368 on the inner surface of leaf spring cover 360 are in contact with the end portions of four spring parts 336 of leaf spring 330. The protrusions 368 act as supporting points when leaf spring 330 elastically deforms.

Figure 7F:
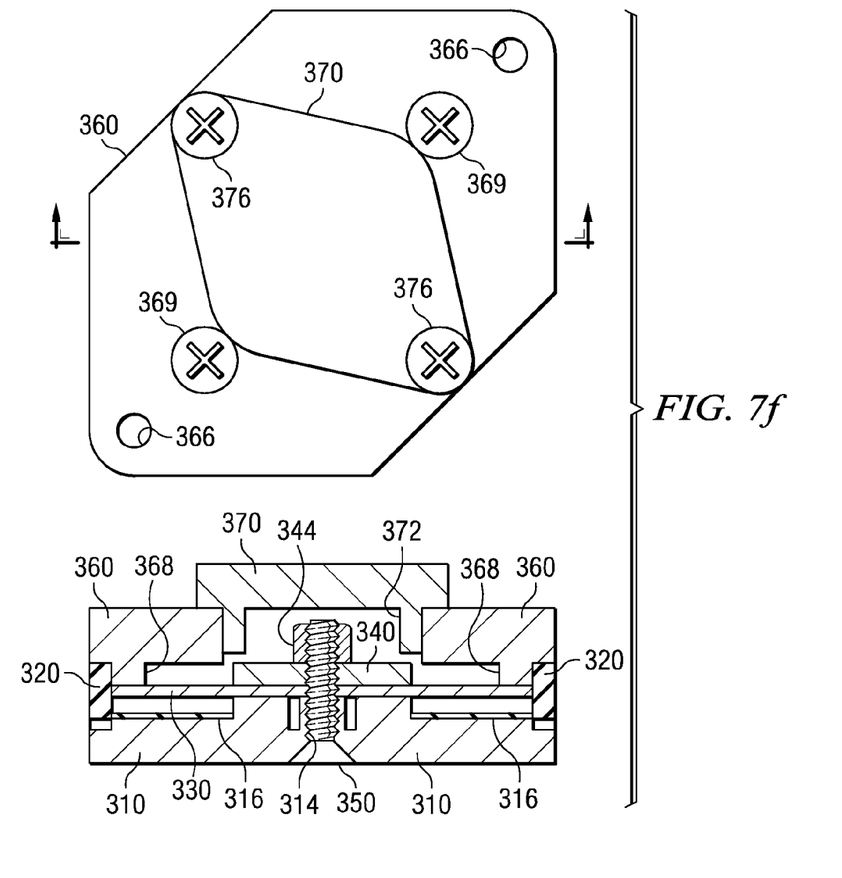

In FIG. 7(f) the cap is attached. The cap 370 is made of a metal, with ring-shaped leg portion 372 formed on its inner surface. Also, on the two end portions of cap 370, openings 374 for flat countersunk head screws are formed (see FIG. 6).

The leg portion 372 is inserted such that it is in contact with the inner edge of opening 362 of the leaf spring cover, and openings 374 for flat countersunk head screws fit openings 364 of the leaf spring cover. Flat countersunk head screws 376 are set from openings 374 towards openings 364, and cap 370 is fixed on leaf spring cover 360. The cap 370 has a dust-proof function and it functions to limit the elastic deformation movement of leaf spring 330, as will be explained later.

As shown in FIGS. 5 and 6, leaf spring mechanism 300 assembled as aforementioned is attached on the probe card. Openings 366 formed at the ends of leaf spring cover 360 fit openings 412 formed on probe card base plate 410, and flat countersunk head screws 420 passing through it are fastened by nuts 430. As a result, leaf spring cover 360 is fixed on probe card base plate 410, and the structure is shown in FIGS. 5 and 6.

In the following, an explanation will be given regarding probe holder 200 with reference to FIG. 10. The probe holder 200 has holder main body 210 that holds plural probes Q, and wiring substrate 220 having holder main body 210 fixed on it. On the outer surface of wiring substrate 220, plural soldering pads 222 are formed. The soldering pads 222 are electrically connected to the electrode pads of probe card base plate 410 by means of coated wiring 224. The inner surface of wiring substrate 220 is flat, and this surface is fixed on the inner surface of pin row base plate 310 by means of an adhesive or screws, etc. Also, the probe holder is set in a way that facilitates quick-connect and quick-disconnect with respect to leaf spring mechanism 300, and it can be exchanged corresponding to the number and configuration of the bump electrodes of the wafer.

Figure 11A:
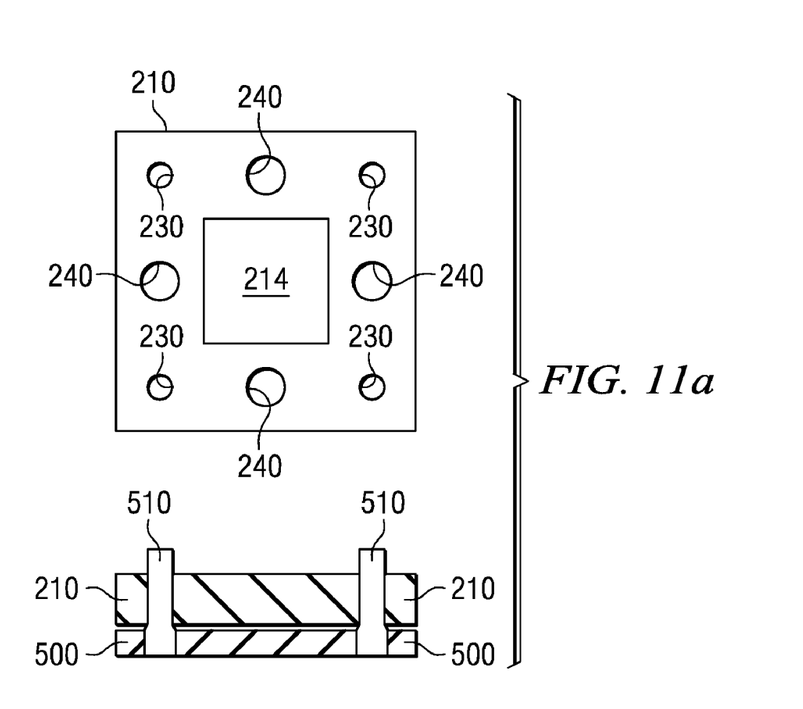
FIG. 11(a) and FIG. 11(b) are diagrams depicting the assembly operation of the probe holder.

In the following, an explanation will be given regarding the assembly structure of the probe holder with reference to FIG. 11(a) and FIG. 11(b). As shown in FIG. 11(a), holder main body 210 is carried on positioning fixture 500. On the corners of holder main body 210, four through-holes 230 are formed. At the center of the various edges, four threaded holes 240 are formed. In addition, in region 214 at the center of holder main body 210, through-holes for inserting probes, not shown in the figure, are formed in a two-dimensional configuration. At the corners of positioning fixture 500, four protruding pins 510 are formed. The pins 510 are inserted into through-holes 230 at the corners of holder main body 210.

Figure 12:
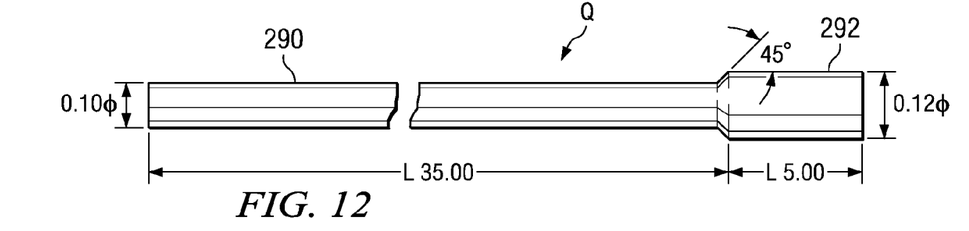
FIG. 12 is a diagram depicting a probe.

Then, probes Q are inserted into the through-holes (not shown in the figure) formed on holder main body 210. FIG. 12 is a diagram depicting the appearance of a probe. Each probe Q has smaller-diameter portion 290 and a larger-diameter portion 292. Preferable materials for the probes include high-hardness materials, such as super-hard steels. The smaller-diameter portion 290 has a diameter of 0.10 mm and length L of 95.0 mm, and the larger-diameter portion 292 has a diameter of 0.12 mm and length l of 5.00 mm.

Because probes Q have a nearly linear shape, they do not have a spring function themselves. Consequently, compared with probes 30 having a spring property (bending portion) for a conventional cobra-type vertical probe card (see FIG. 19(a)), this type of probe can be manufactured more easily, and it is possible to cut the cost. In addition, since probes Q can be processed in a relatively easy way, there is no specific restriction on the type of material used, and one may appropriately select from high-hardness materials.

Each probe Q is inserted into a through-hole of holder main body 210, and larger-diameter portion 292 fits the interior of a through-hole such that a portion of larger-diameter portion 292 protrudes a little from the outer surface of holder main body 210. The probes Q are attached such that they fit the configuration and pitch of the bump electrodes.

Figure 11B:
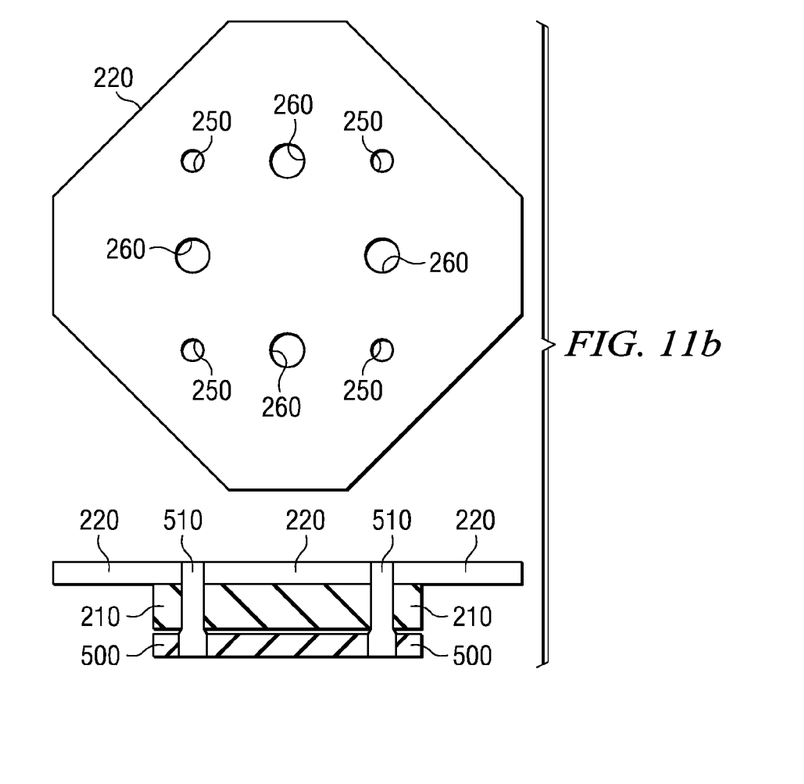

Then, as shown in FIG. 11(b), on holder main body 210, wiring substrate 220 is carried. In four through-holes 250 formed on wiring substrate 220, pins 510 of positioning fixture 500 are inserted. The end portions of the probes protruding from the outer surface of holder main body 210 are connected to the desired electrode pads of wiring substrate 220. Also, on wiring substrate 220, four threaded holes 260 corresponding to four threaded holes 240 on holder main body 210 are formed. For electrical connection between the electrical pads of wiring substrate 220 and the probes, an electrically conductive sheet can be included between them to realize electric connection.

Figure 10:
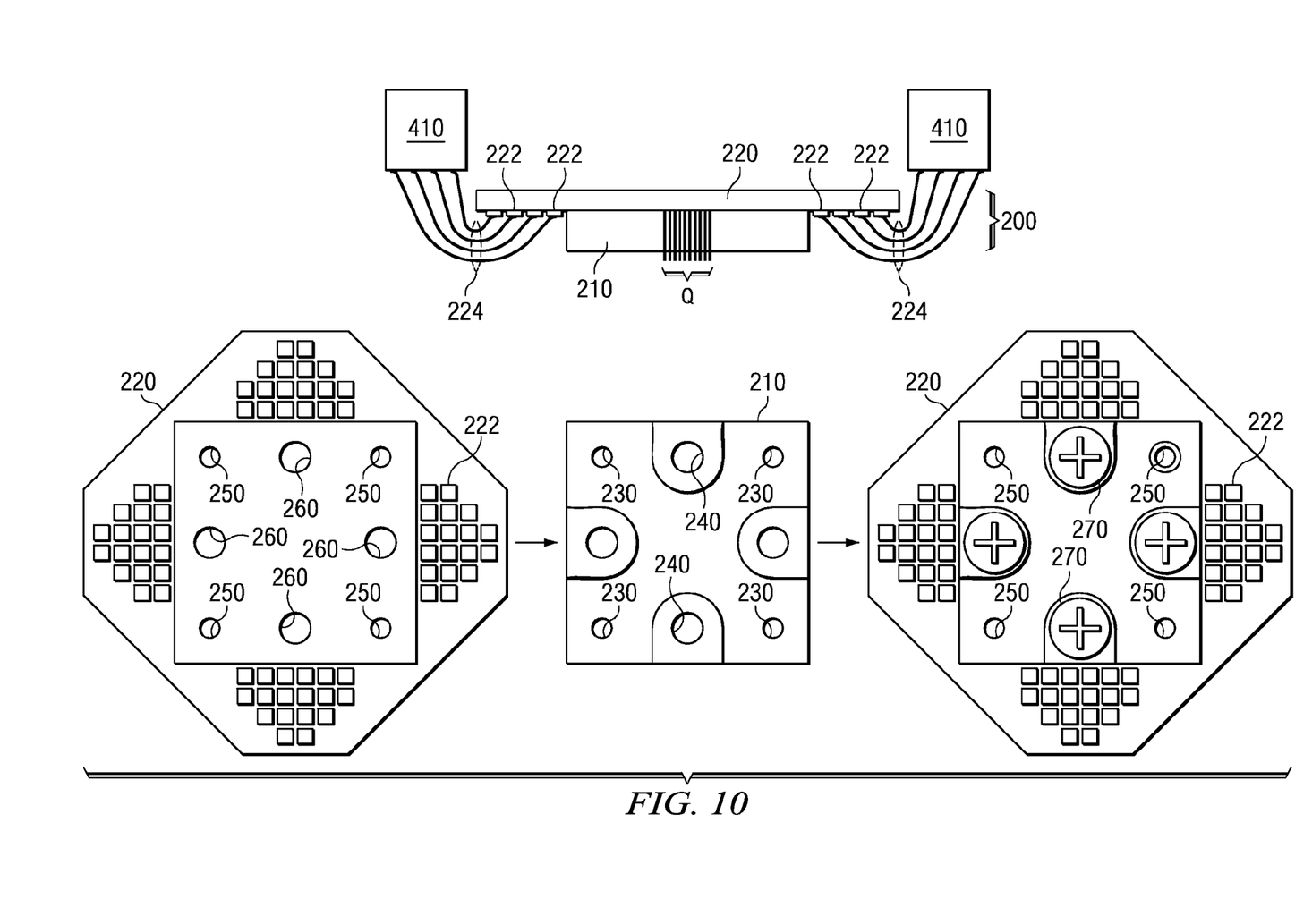
FIG. 10 is a diagram depicting the probe holder.

Then, as shown in FIG. 10, threaded holes 260 on wiring substrate 220 are aligned with the four threaded holes 240 on holder main body 210. The threaded holes 260, 240 are fastened by screws 270, so that holder main body 210 and wiring substrate 220 are fixed. Then, positioning fixture 500 is removed. In this way, probe holder 200 shown in FIG. 10 is obtained.

Figure 13A:
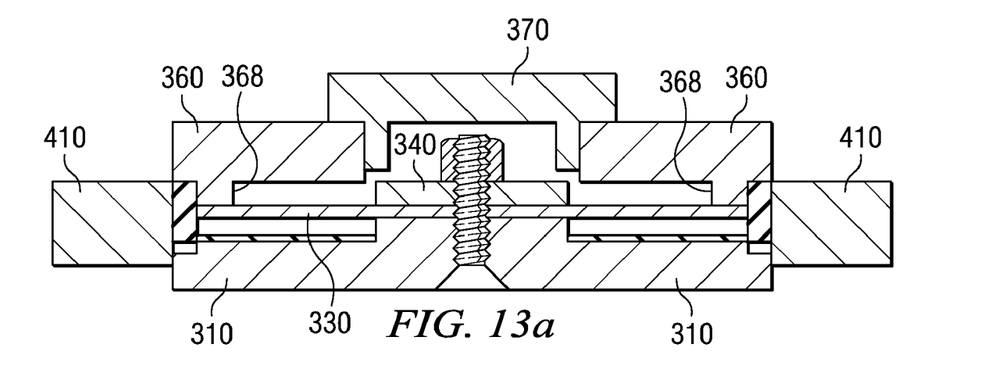
Figure 13B:
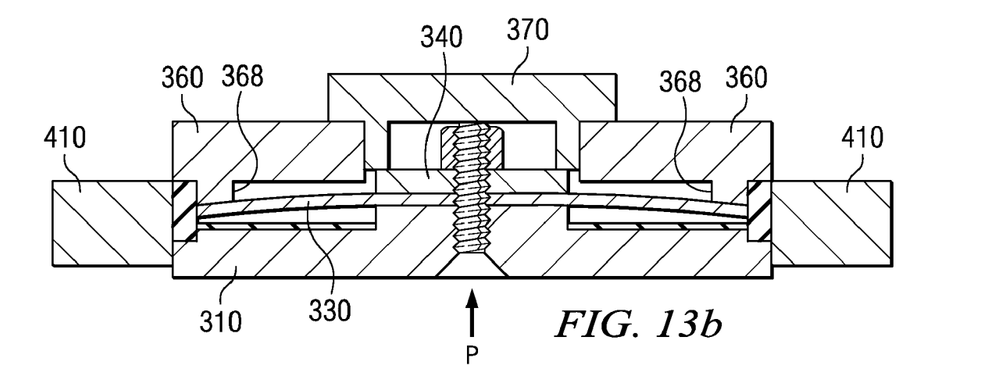

In the following, an explanation will be given regarding the operation of the probe card in this embodiment with reference to FIG. 13(a) and FIG. 13(b). First, the probe card is positioned so that it faces the wafer. Then, the probe card is driven to move towards the wafer. When the probe tips come into contact with the bump electrodes, elastic deformation of leaf spring 330 has not begun, and the state is that shown in FIG. 13(a).

Then the probe card is driven to move, and the probes are overdriven. As a result, as shown in FIG. 13(b), under load P from probe holder 200, pin row base plate 310 is pressed upward, and elastic deformation begins for leaf spring 330 held between pin row base plate 310 and leaf spring spacer 340. The end portions of the four spring parts 336 of leaf spring 330 bend with protrusions 368 of leaf spring cover 360 as the supporting points, and pin row base plate 310 moves towards leaf spring cover 360. The bending of leaf spring 330 gives a prescribed contact pressure between the probe tips and the bump electrodes.

Here, one should note the fact that the elastic deformation distance of the leaf spring is defined by the spacing between the upper surface of leaf spring spacer 340 and leg portion 372 of cap 370. That is, due to the elastic deformation of leaf spring 330, leaf spring spacer 340 is displaced in the vertical direction, and leaf spring 330 can elastically deform until leaf spring spacer 340 comes into contact with leg portion 372. The spacing between leaf spring spacer 340 and leg portion 372 is about 300 μm.

In the following, an explanation will be given regarding displacement of the leaf spring. The leaf spring used in this embodiment has a simple cantilever structure having four spring parts 336. Displacement δ under a load can be computed by the formula shown in FIG. 14.

Figure 14:
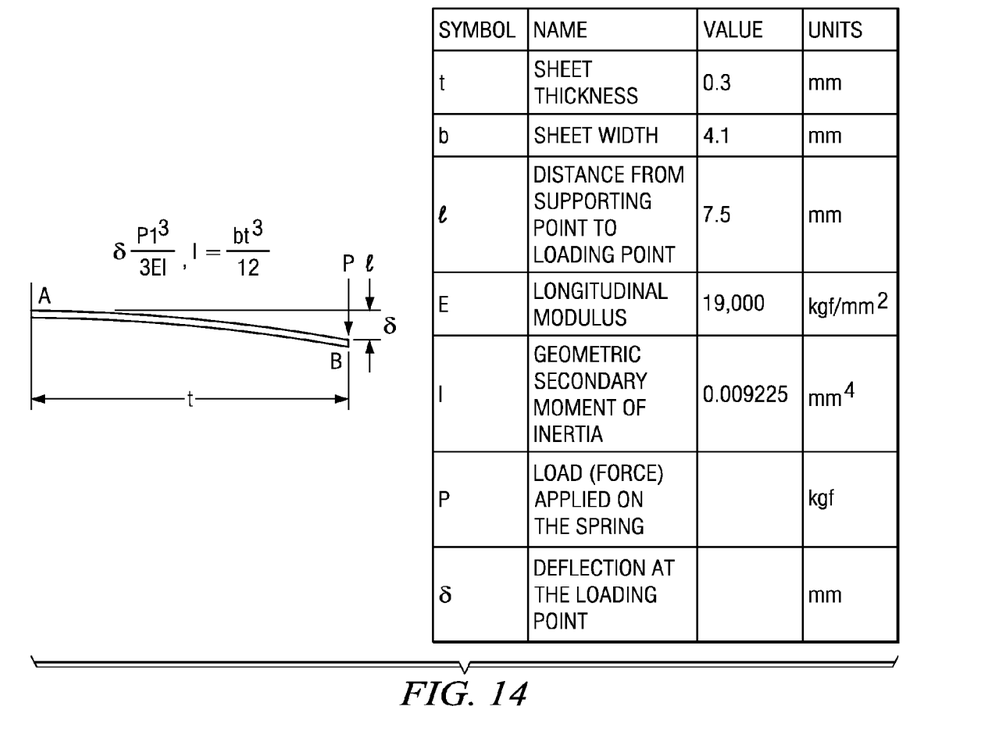
FIG. 14 is a diagram depicting displacement of the probes of the probe assembly.
Figure 15:
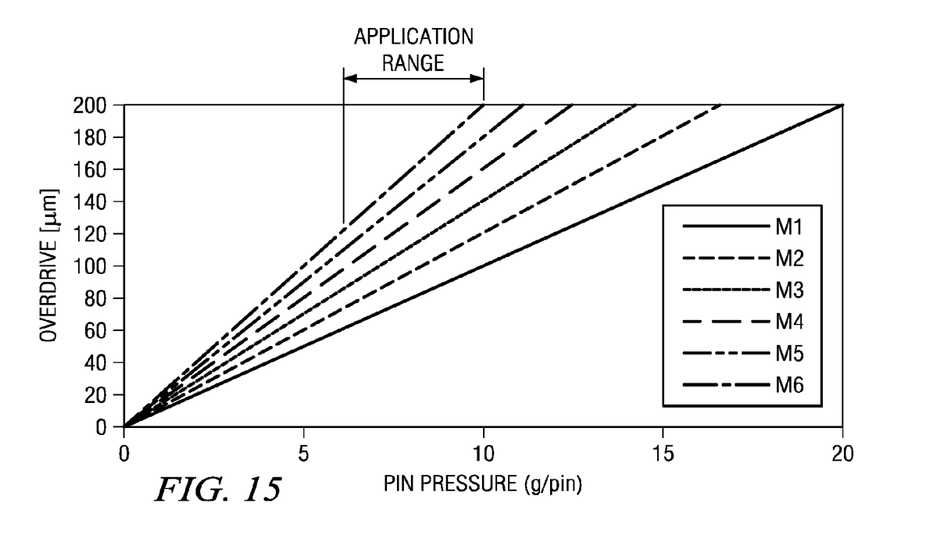
FIG. 15 is a graph depicting the relationship between the overdrive applied to the probes and the pin pressure.

Also, as shown in FIG. 14, when plate thickness t, plate width b, distance l from the supporting point to the loading point, longitudinal modulus E, and geometrical secondary moment of inertia I are given as parameters, the overdrive and the pin pressure for each probe versus the total probe number has the relationship shown in FIG. 15. In this figure, the ordinate represents the magnitude of overdrive (μm), and the abscissa represents the pin pressure (g/pin). M1 has 50 pins, M2 has 60 pins, M3 has 70 pins, M4 has 80 pins, M5 has 90 pins, and M6 has 100 pins. Preferably, the pin pressure on the high-hardness lead-free bump electrodes is 6-10 g/pin.

As explained above, for a probe card having the probe assembly of the present embodiment mounted on it, the probes themselves have no spring function, while the probe holder that holds the probes is elastically supported. As a result, the structure of the probes becomes simple, the manufacturing cost can be cut, and the probes are made of a material with high wear-resistance. In addition, because the probes themselves do not elastically deform, a uniform distribution in the sliding distance and pin pressure for the various probes can be obtained. Even for high-hardness lead-free bump electrodes as the contact object, it is still possible to suppress the deformation of the bump electrodes below a prescribed level, and contact with the bump electrodes can be provided with high reliability. In addition, by suppressing the sliding distance of the probes below a prescribed level, it is possible to lower the cleaning frequency of the probes, and to obtain a longer lifetime than that of conventional probes. For example, for the application range shown in FIG. 15, 5 million rounds of contact are possible. As a result, the cost needed for probe testing can be cut significantly.

In the above, a detailed explanation was provided for an embodiment of the present invention. However, the present invention is not limited to the aforementioned prescribed embodiment. Various modifications or changes can be made as long as the gist of the present invention described in the Claims is observed. For example, in the embodiment, the leaf spring has four spring portions. Obviously, other patterns may also be adopted. In addition, the pin row base plate, leaf spring receptacle, and leaf spring cover explained above are only examples. Other shapes can be adopted corresponding to the design. In addition, in the above, bump electrodes are shown as an example of the contact object. However, electrode pads, contact pads, etc., in addition to bumps, also can be adopted.

INDUSTRIAL APPLICATION FIELD

The present invention provides a type of probe card or the like that is used in performing tests of integrated circuits, etc.

What is claimed is:

1. A probe card comprising:
   a probe card base plate;
   a probe assembly with a holding block that holds plural probes at prescribed positions;
   an elastic mechanism unit having a first connecting member connected to the probe card base plate and a second connecting member connecting the holding block; and
   the second connecting member drivable to move towards and away from the first connecting member via a leaf spring made of a metal material having a base portion and plural spring parts extending from the base portion; the base portion fixed on the second connecting member, and end portions of said plural spring parts in contact with protrusions formed on said first connecting member.

2. The probe card of claim 1, in which the second connecting member has the holding block attached on a first surface, and has the leaf spring attached on a second surface opposite the first surface; and in which the leaf spring is in contact with the protrusions, and it is elastically deformable with the bump as a supporting point.

3. The probe card of claim 1, in which the plural spring parts are set in a configuration of linear symmetry or rotational symmetry with respect to the base portion.

4. The probe card of claim 3, in which the spring parts extend equidistantly in four directions from the base portion.

5. The probe card of, claim 1 in which the leaf spring contains plural loss-prevention fin parts formed in its base portion, and in which the second connecting member is suspended on the first connecting member by the plural loss-prevention fin parts.

6. The probe card of claim 1 further comprising a regulating member, which is attached on the first connecting member and which defines the movement distance of the second connecting member to the first connecting member.

7. The probe card described in claim 1, in which the holding block is attached on the second connecting member in way that allows quick connect and quick disconnect.

8. A process of testing semiconductor devices with a probe card including a probe assembly having a holding block that holds plural probes at prescribed positions, an elastic mechanism unit having a first connecting member connected to a probe card base plate and a second connecting member connecting the holding block, the second connecting member drivable to move towards and away from the first connecting member via a leaf spring made of a metal material having a base portion and plural spring parts extending from the base portion; the base portion fixed on the second connecting member, and end portions of said plural spring parts in contact with a bump on said first connecting member.

* * * * *